(12) United States Patent
Matsumoto et al.

(10) Patent No.: US 8,853,559 B2
(45) Date of Patent: Oct. 7, 2014

(54) INSULATION CIRCUIT BOARD, AND POWER SEMICONDUCTOR DEVICE OR INVERTER MODULE USING THE SAME

(75) Inventors: Hironori Matsumoto, Hitachi (JP); Jumpei Kusukawa, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 248 days.

(21) Appl. No.: 13/388,450

(22) PCT Filed: Feb. 24, 2010

(86) PCT No.: PCT/JP2010/052847
§ 371 (c)(1),
(2), (4) Date: Feb. 2, 2012

(87) PCT Pub. No.: WO2011/040054
PCT Pub. Date: Apr. 7, 2011

(65) Prior Publication Data
US 2012/0127684 A1    May 24, 2012

(30) Foreign Application Priority Data
Sep. 30, 2009  (JP) ................ 2009-225903

(51) Int. Cl.
| | |
|---|---|
| H05K 1/11 | (2006.01) |
| H01L 23/62 | (2006.01) |
| H01L 25/18 | (2006.01) |
| H05K 1/02 | (2006.01) |
| H01L 23/64 | (2006.01) |
| H01L 23/14 | (2006.01) |
| H01L 25/07 | (2006.01) |
| H05K 1/05 | (2006.01) |
| H05K 1/03 | (2006.01) |
| H05K 7/00 | (2006.01) |
| H05K 1/18 | (2006.01) |
| H01L 23/498 | (2006.01) |

(52) U.S. Cl.
CPC ...... *H05K 1/056* (2013.01); *H01L 2924/09701* (2013.01); *H01L 2924/12044* (2013.01); *H01L 23/62* (2013.01); *H01L 25/18* (2013.01); *H05K 2201/09781* (2013.01); *H05K 1/0256* (2013.01); *H01L 23/647* (2013.01); *H01L 23/142* (2013.01); *H05K 2201/10022* (2013.01); *H01L 25/072* (2013.01); *H01L 23/49844* (2013.01); *H05K 2201/0761* (2013.01); *H05K 2201/0209* (2013.01); *H05K 1/0262* (2013.01)
USPC ........... 174/261; 174/268; 174/255; 361/760; 361/761; 361/777; 361/778; 361/783

(58) Field of Classification Search
USPC ............... 174/261, 268, 255, 256, 257, 258; 361/748, 750, 751, 753, 760, 761, 762, 361/766, 777, 778, 780, 782, 783
See application file for complete search history.

(56) References Cited

U.S. PATENT DOCUMENTS 5,384,683 A * 1/1995 Tsunoda .................. 361/313
6,504,110 B1    1/2003 Kusukawa et al.

FOREIGN PATENT DOCUMENTS

| JP | 2000-252597 | 9/2000 |
|---|---|---|
| JP | 2001-57409 | 2/2001 |
| JP | 2001-177054 | 6/2001 |
| JP | 2003-303940 | 10/2003 |
| JP | 2009-65017 | 3/2009 |

* cited by examiner

*Primary Examiner* — Hoa C Nguyen
*Assistant Examiner* — Binh Tran
(74) *Attorney, Agent, or Firm* — Antonelli, Terry, Stout & Kraus, LLP.

(57) ABSTRACT

The invention relates to a high-voltage insulation circuit board which is used in an electric power apparatus such as an electric power converter or the like such as power semiconductor device, inverter module, or the like and provides an insulation circuit board in which electric field concentration at the end sections of a wiring pattern is reduced, partial discharging is suppressed, and a reliability is high. According to the invention, there is provided an insulation circuit board having: a metal base substrate; and wiring patterns which are formed onto at least one of the surfaces of the metal base substrate through an insulation layer, characterized in that between two adjacent wiring patterns in which an electric potential difference exists among the wiring patterns, at least one or more wiring patterns or conductors which are in contact with the insulation layer and have an electric potential in a range of the electric potential difference between the adjacent wiring patterns are arranged. According to the invention, the electric field concentration at the end sections of the wiring pattern to which a high voltage is applied is reduced and partial-discharge-resistant characteristics are improved.

12 Claims, 11 Drawing Sheets

INSULATION CIRCUIT BOARD, AND POWER SEMICONDUCTOR DEVICE OR INVERTER MODULE USING THE SAME

INCORPORATION BY REFERENCE

The present application claims priority from Japanese Patent Application JP2009-225903 filed on Sep. 30, 2009, the content of which is hereby incorporated by reference into this application.

TECHNICAL FIELD

The invention relates to a high-voltage insulation circuit board which is used in an electric power apparatus such as an electric power converter or the like such as power semiconductor device, inverter module, or the like and to a power semiconductor device or inverter module using such an insulation circuit board.

BACKGROUND ART

Hitherto, as an insulation circuit board for an electronic apparatus which is subjected to a severe temperature environment such as a vehicle-mounting environment or the like, a ceramic board having excellent heat radiation performance and heat resistance is a main stream. However, in association with a demand for low costs of the electronic apparatus, a shift to a resin board in which a high radiation insulation resin is used for an insulation layer is increasing year by year.

As shown in FIG. 2, the insulation circuit board by the resin insulation layer (hereinbelow, referred to as an insulation circuit board) is constructed in such a manner that a metal foil such as a copper foil or the like which was coarse-processed is adhered to one or both of the surfaces of a metal base substrate 1 such as aluminum, copper, iron, or the like through an insulation layer 2 whose thermal conductivity has been improved such as a high thermal conductive resin or the like having excellent heat radiation performance, and thereafter, wiring patterns 3 are formed by a chemical etching or the like so as to be away from each other by a distance R1 between the wiring patterns. For example, in the case of a power semiconductor device or inverter module, a plurality of semiconductor elements and passive elements are arranged on the wiring patterns 3 on the insulation circuit board. However, since a high power switching element such as an insulated-gate bipolar transistor (IGBT) or the like is used as a power semiconductor device for electric power conversion or an inverter module in recent years, there is a problem of an excessive heat generation. At present, in order to efficiently propagate the generated heat to the metal base substrate 1, an inorganic filler is filled into the resin of the insulation layer 2 at a high density or a thickness of insulation layer 2 is made thin, thereby improving the thermal conductivity of the insulation layer 2. As for the former method of filling the filler into the resin of the insulation layer 2 at the high density, an insulation circuit board in which an alumina filler of 70 Vol % or more was mixed into the insulation resin which is in contact with the metal base substrate 1 has also been developed, and high thermal conductivity which reaches 10 W/mk has been realized. As for the latter method of making the thickness of insulation layer 2 thin, an insulation circuit board using the insulation layer 2 having a layer thickness of about 200 μmt or having the smallest layer thickness of about 100 μmt has been developed. However, if a high voltage associated with the realization of the recent high power is always applied to such an insulation circuit board, such a problem that a dielectric breakdown occurs for a short time can occur.

The dielectric breakdown mentioned above will now be described by using FIG. 3. As shown in FIG. 3, in the wiring pattern 3 to which the high voltage is applied, the generation of partial discharging 4 that is caused by electric field concentration at end sections of the wiring pattern 3 is a main cause. Particularly, in the case of an AC voltage in which a polarity of the applied voltage changes continuously, the discharge occurs continuously, so that the insulation layer 2 is deteriorated, a dendritic discharge deterioration trace called a tree 5 is formed, and a dielectric breakdown occurs soon. Also in the case where the wiring patterns 3 are closely formed due to the high density of mounted parts, a dendritic discharge path (creeping discharge 6) is formed along the surface of an insulation material by the partial discharging 4 and a dielectric breakdown occurs. At present, the wiring pattern 3 which is formed by the chemical etching or the like from a viewpoint of priority of costs generally has such a shape that a side surface portion of the wiring pattern 3 becomes an arc. It has such a shape that the side surface portion of the wiring pattern 3, in more detail, the side surface portion of the wiring pattern 3 which is in contact with a creeping portion of the insulation layer 2 is sharply pointed. There is consequently such a problem that an electric field is concentrated on the end sections of the wiring pattern 3 and the partial discharging 4 occurs easily at this portion as a starting point. In order to lighten the electric field concentration at the end sections of the wiring pattern 3, it is effective to round the sharp shape of the end section of the wiring pattern 3. In [Patent Literature 1], by forming the wiring pattern 3 into a concave portion 7 of the insulation layer 2 in which peripheral end sections are curved as shown in FIG. 4, the end section of the wiring pattern 3 has a round shape. Further, in [Patent Literature 2], a method of fusing and smoothing the end section of the wiring pattern 3 by a pre-discharge, a laser, or the like has been proposed.

CITATION LIST

Patent Literature

Patent Literature 1 JP-A-2001-057409
Patent Literature 2 JP-A-2001-177054

SUMMARY OF INVENTION

Technical Problem

However, according to the Patent Literature 1, since the concave portion 7 is formed in the insulation layer 2, a pre-process is necessary and in the case of comparing with the forming method of the wiring pattern 3 in the related art, costs rise. Also, according to the Patent Literature 2, since it is necessary to work the shape of the end section of the wiring pattern 3 by the discharge, laser, or the like, costs rise similarly. Further, according to the Patent Literature 2, there are such many problems that since it can be applied only to a ceramic substrate, an applying range is limited, since a solder wettability due to an increase in substrate temperature at the time of fusing deteriorates, fine processing techniques such as a proper processing time and the like are necessary, and the like. On the other hand, it is an object of the invention to provide an insulation circuit board in which the electric field concentration at the end sections of the wiring pattern 3 is reduced, the partial discharging 4 is suppressed, and the reliability is high although the existing insulation circuit board and forming method of the wiring pattern 3 by the chemical etching are used. It is a further object of the invention to provide a power semiconductor device or inverter module having a high insulation reliability by using the insulation circuit board using the wiring pattern 3.

Solution to Problem

To accomplish the above objects, according to the invention, there is provided an insulation circuit board comprising: a metal base substrate; and wiring patterns which are formed onto at least one of surfaces of the metal base substrate through an insulation layer, characterized in that between two adjacent wiring patterns in which an electric potential difference exists among the wiring patterns, at least one or more wiring patterns or conductors which are in contact with the insulation layer and have an electric potential in a range of the electric potential difference between the adjacent wiring patterns are arranged.

Further, according to the invention, the insulation circuit board is characterized in that the insulation layer which is in contact with the metal base substrate and the wiring patterns is one of a resin mainly consisting of an epoxy resin, a resin mainly consisting of a polyimide resin, a resin mainly consisting of a silicone resin, a resin mainly consisting of an acrylic resin, and a resin mainly consisting of an urethane resin or a resin consisting of a denatured material or mixture of those resins.

Further, according to the invention, the insulation circuit board is characterized in that an inorganic filler which is dispersed into the insulation layer which is in contact with the metal base substrate and the wiring patterns is one of $Al_2O_3$ (alumina), $SiO_2$ (silica), AlN (aluminum nitride), BN (boron nitride), ZnO (zinc oxide), SiC (silicon carbide), $Si_3N_4$ (silicon nitride), and MgO (magnesium oxide), a filler adapted to improve heat radiation performance and insulation performance in a manner similar to those compounds, or a mixture of two or more kinds of those compounds.

Further, according to the invention, the insulation circuit board is characterized in that the insulation layer which is in contact with the metal base substrate and the wiring patterns is one of ceramic materials each mainly consisting of $Al_2O_3$ (alumina), $ZrO_2$ (zirconia), AlN (aluminum nitride), or BN (boron nitride), a ceramic material which has characteristics similar to those of those ceramic materials, whose fundamental component consists of a metal oxide, and which is burned and solidified by a heat treatment of a high temperature, or an inorganic material consisting of a denatured material or mixture obtained by mixing a glass component into the ceramic material.

Further, according to the invention, the insulation circuit board is characterized in that in order to provide the electric potential in the range of the potential difference between the adjacent wiring patterns, a resistor is arranged between the two adjacent wiring patterns where the electric potential difference exists.

Further, according to the invention, the insulation circuit board is characterized in that the electric potential in the range of the potential difference between the adjacent wiring patterns is provided from a circuit for forming the electric potential by a portion other than a portion on the insulation circuit board.

Further, it is an object of the invention to provide a power semiconductor device or inverter module characterized in that the foregoing insulation circuit board is used, circuit parts including semiconductor elements connected to the wiring patterns are mounted, and the wiring patterns are arranged.

To accomplish the above object, according to the invention, there is provided a power semiconductor device comprising: a metal base substrate; wiring patterns which are formed onto at least one of surfaces of the metal base substrate through an insulation layer; and semiconductor elements connected to the wiring patterns, characterized in that between two adjacent wiring patterns in which an electric potential difference exists among the wiring patterns, at least one or more wiring patterns or conductors which are in contact with the insulation layer and have an electric potential in a range of the electric potential difference between the adjacent wiring patterns are arranged.

Further, according to the invention, the power semiconductor device is characterized in that the two adjacent wiring patterns are an input potential wiring pattern and a ground potential wiring pattern.

Further, according to the invention, the power semiconductor device is characterized in that the two adjacent wiring patterns are output wiring patterns of a three-phase alternating current connected to the semiconductor elements.

Further, it is an object of the invention to provide an inverter module having the foregoing power semiconductor device.

Advantageous Effects of Invention

According to the invention, while using the conventional insulation circuit board construction and wiring pattern forming method, the electric field concentration at the end sections of the wiring pattern to which a high voltage is applied is reduced and partial-discharge-resistant characteristics are improved. Therefore, even in high-density mounted wirings in which a distance between the wiring patterns is small, the insulation circuit board having the high insulation reliability can be realized by low costs. Providing of the power semiconductor device or inverter module using the insulation circuit board and having the high insulation reliability can be realized.

Other objects, features, and advantages of the present invention will be apparent from the following description of the embodiments of the invention with reference to the accompanying drawings.

DESCRIPTION OF EMBODIMENTS

Embodiments of the invention will be described hereinbelow by using the drawings.

The drawings which are used in the following description are schematic diagrams and it should be noted that a relation between a thickness and plane dimensions, ratios among the thicknesses of respective layers, and the like differ from those of an actual circuit board. Therefore, specific thicknesses and dimensions should be judged in consideration of the following description. Naturally, portions whose dimensional relations and ratios differ are also included in the respective drawings.

First Embodiment

Figure 1:
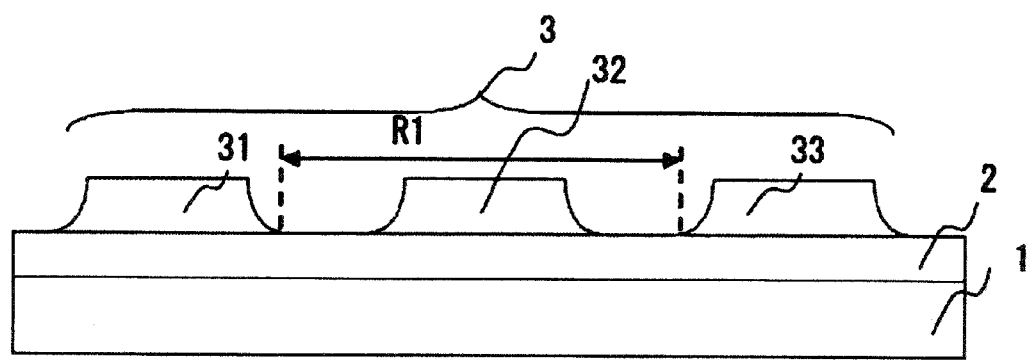
FIG. 1 Cross sectional view of an insulation circuit board and wiring patterns for describing an embodiment of the invention.
Figure 2:
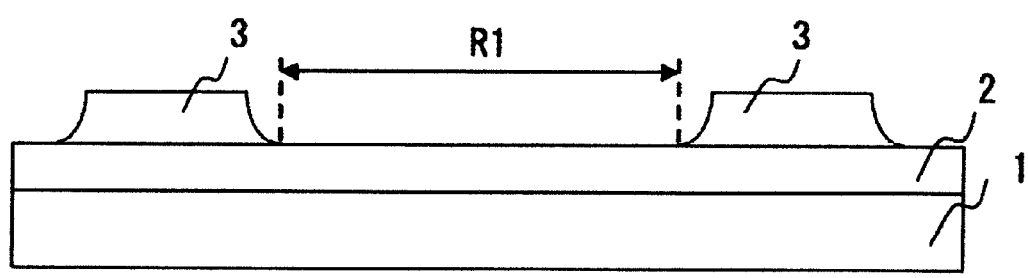
FIG. 2 Cross sectional view for explaining conventional insulation circuit board and wiring patterns.
Figure 3:
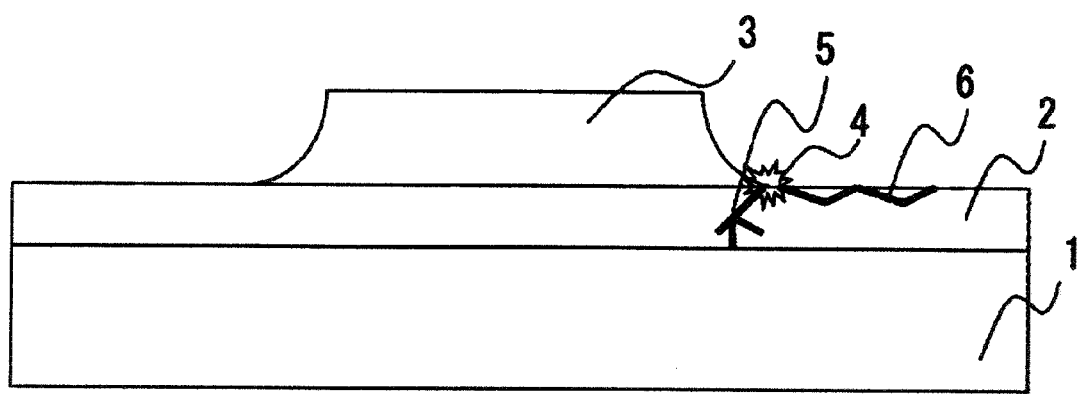
FIG. 3 Enlarged cross sectional view of the conventional insulation circuit board and wiring pattern and it is a cross sectional view for explaining sharp shapes of end sections of the wiring pattern, electric field concentration at the end sections of the wiring pattern, a tree deterioration, and a creeping discharge.
Figure 4:
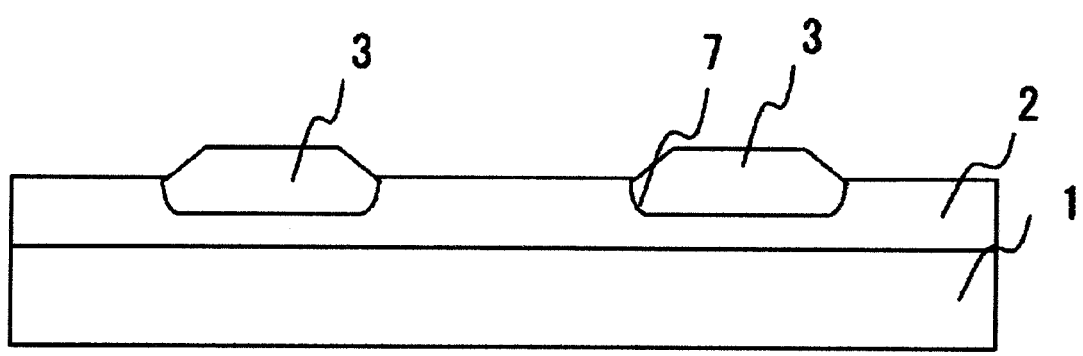
FIG. 4 Cross sectional view of an insulation circuit board and wiring patterns for describing shapes of end sections of the wiring patterns in JP-A-2001-057409.
Figure 6:
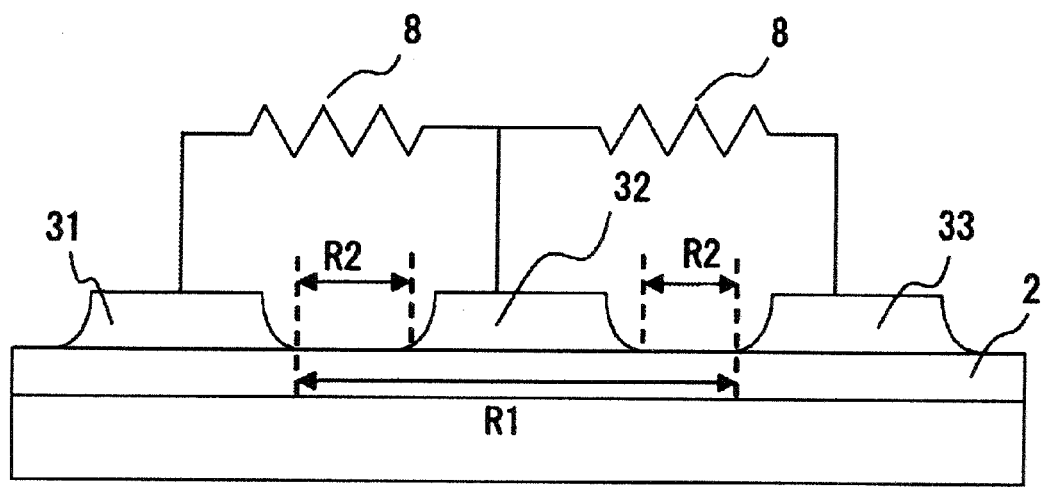
FIG. 6 Cross sectional view of an insulation circuit board and wiring patterns showing an embodiment of the invention and it is a diagram for explaining the wiring patterns having an intermediate electric potential.

Each of FIGS. 1 and 6 is a cross sectional view of an insulation circuit board according to an embodiment of the invention. The embodiment illustrated in FIG. 6 has such a construction that in FIG. 2 showing a conventional embodiment, between adjacent wiring patterns 31 and 33 which are away from each other by the distance R1 between the wiring patterns, a new wiring pattern 32 is arranged at a position of a distance R2 between the wiring patterns corresponding to an equal distance from each of the wiring patterns 31 and 33. Other constructions are similar to those shown in FIG. 2 unless otherwise specified in particular.

The embodiment of FIG. 6 differs largely from the conventional embodiment with respect to a point that the wiring pattern 32 arranged between the adjacent wiring patterns 31 and 33 in FIG. 2 is voltage-divided by two resistors 8 and has an intermediate electric potential of an electric potential difference between the wiring patterns 31 and 33. For example, if the wiring pattern 31 on the high potential side in FIG. 2 has an electric potential of 1 kV and the wiring pattern 33 on the low potential side has an electric potential of 0V, an electric potential of the wiring pattern 32 in FIG. 6 is equal to 500V and a potential difference between the wiring patterns 31 and 32 or between the wiring patterns 32 and 33 is equal to 500V.

The potential difference between the adjacent wiring patterns 31 and 33 in the embodiment denotes a potential difference at a certain time point in the case where an electric potential which is applied to the wiring pattern 3 time-sequentially changes and the potential difference between the adjacent wiring patterns 31 and 33 changes. Therefore, even if the potential difference between the adjacent wiring patterns 31 and 33 is not high at a certain time point, in the case where the potential difference between the adjacent wiring patterns 31 and 33 is large at a different time point, such a case is incorporated in the adjacent wiring patterns 31 and 33.

In the invention, in the case where one or more wiring patterns 32 or conductors having an electric potential in a range of the potential difference between the adjacent wiring patterns 31 and 33 showing the high potential difference is/are arranged, it is desirable that a potential difference between the wiring pattern 31 on the high potential side and the wiring pattern 32 and a potential difference between the wiring pattern 32 and the wiring pattern 33 on the low potential side are equal to 350V or less. It is a value which is obtained from a Paschen's law. According to the Paschen's law, it is mentioned that a lowest value of the potential difference at the time of occurrence of a spark discharge in the air at an ordinary temperature in the case of presuming a parallel electric field is equal to about 350V. Therefore, this is because when a space other than the insulation layer 2 which is in contact with the wiring patterns 31, 32, and 33 was filled with a filler such as a sealing resin or the like, even if a void or the like occurred, so long as the potential difference between the wiring patterns 3 is equal to 350V or less, no discharge occurs in the void.

In the invention, if two or more wiring patterns 32 or conductors are arranged, it is desirable that a potential difference between the adjacent wiring patterns 32 or conductors is equal to 350V or less. Thus, this is because from the Paschen's law mentioned above, when the space other than the insulation layer 2 which is in contact with the wiring patterns 32 or conductors was filled with the filler such as a sealing resin or the like, even if the void or the like occurred, so long as the potential difference between the wiring patterns 32 or conductors is equal to 350V or less, no discharge occurs in the void.

Thus, according to the embodiment, since the potential difference between the adjacent wiring patterns 3 decreases, when the voltage is applied, the electric field concentration at the end sections of the wiring pattern 31 on the high potential side is lightened, thereby raising a partial discharging voltage. The partial-discharge-resistant performance of the insulation circuit board in FIG. 2 can be improved.

The wiring pattern 32 which is newly arranged has a material and a shape similar to those of the adjacent wiring patterns 31 and 33. Therefore, the embodiment according to the invention can be easily realized by the conventional insulation circuit construction and forming method of the wiring patterns 3. The insulation performance of the insulation circuit board can be improved by low costs.

Figure 5:
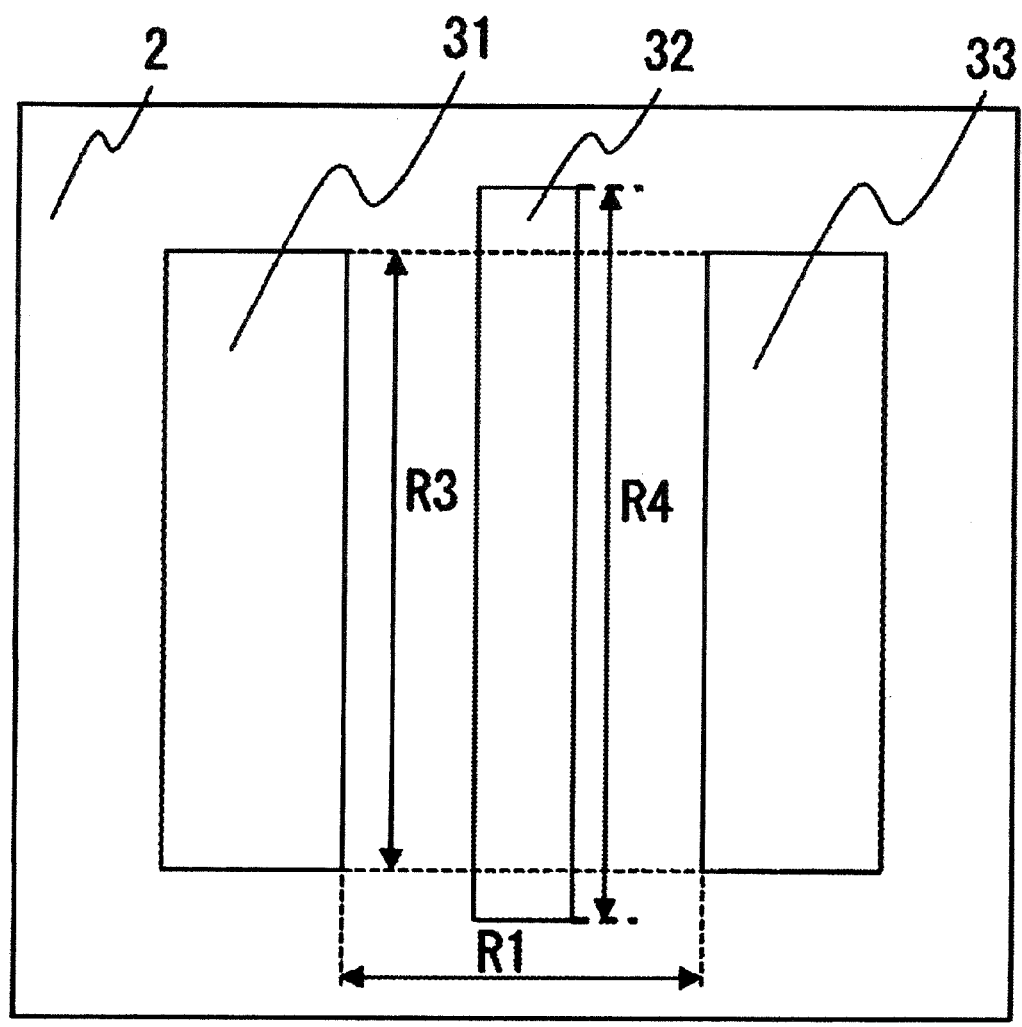
FIG. 5 Plan view of the insulation circuit board for describing plan shapes of the wiring patterns of the invention.

As shown in FIG. 5, it is desirable that the wiring pattern 32 or conductor has a wiring pattern length R4 or conductor length which is equal to or longer than an orientation length R3 of the wiring patterns 31 and 33 showing the high potential difference.

Figure 7:
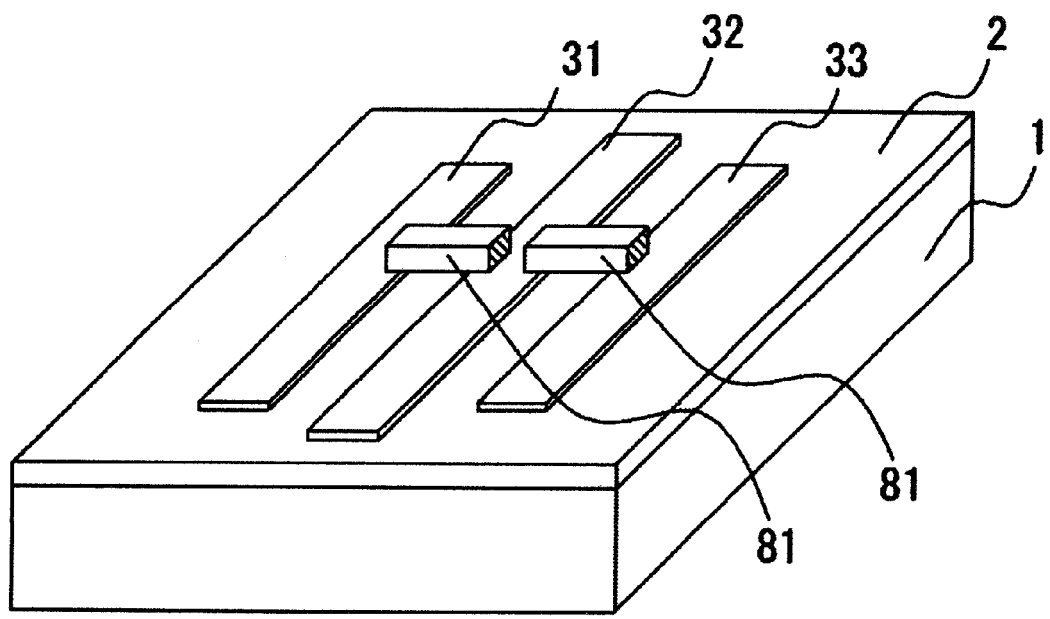
FIG. 7 Perspective view showing the embodiment of the invention and for explaining passive elements to form the intermediate electric potential and a connecting method.

Further, in order to realize the embodiment of the invention shown in FIG. 6, for example, as shown in FIG. 7, it is sufficient to connect the wiring patterns 31 and 32 on the insulation circuit board by a chip resistor 81 and to connect the wiring patterns 32 and 33 on the insulation circuit board by a chip resistor 81. As for the chip resistor 81, a small article whose vertical and lateral sizes are equal to 1 mm or less is also commercially available and it can be also easily mounted even in the wiring patterns 3 for high-density mounting to which applying of the invention thereto is assumed.

In the case where the density of the wiring patterns 3 on the insulation circuit board is high and an element, for example, the chip resistor or the like to form the potential difference between the wiring patterns 31 and 33 showing the high potential difference cannot be mounted to the wiring patterns 3 on the insulation circuit board, it is sufficient to form an electric potential for the wiring pattern 32 by a portion other than the portion on the insulation circuit board. For this purpose, for example, a bus bar wiring for supplying a power source to the insulation circuit board, a terminal portion of a capacitor for the power source, or the like corresponds to such a portion. It is sufficient to supply an input voltage including the intermediate electric potential formed there to the insulation circuit board.

Thus, the intermediate electric potential can be easily obtained even in the insulation circuit board on which the wiring patterns are formed at a high density and the elements are mounted without a gap.

Second Embodiment

Figure 8:
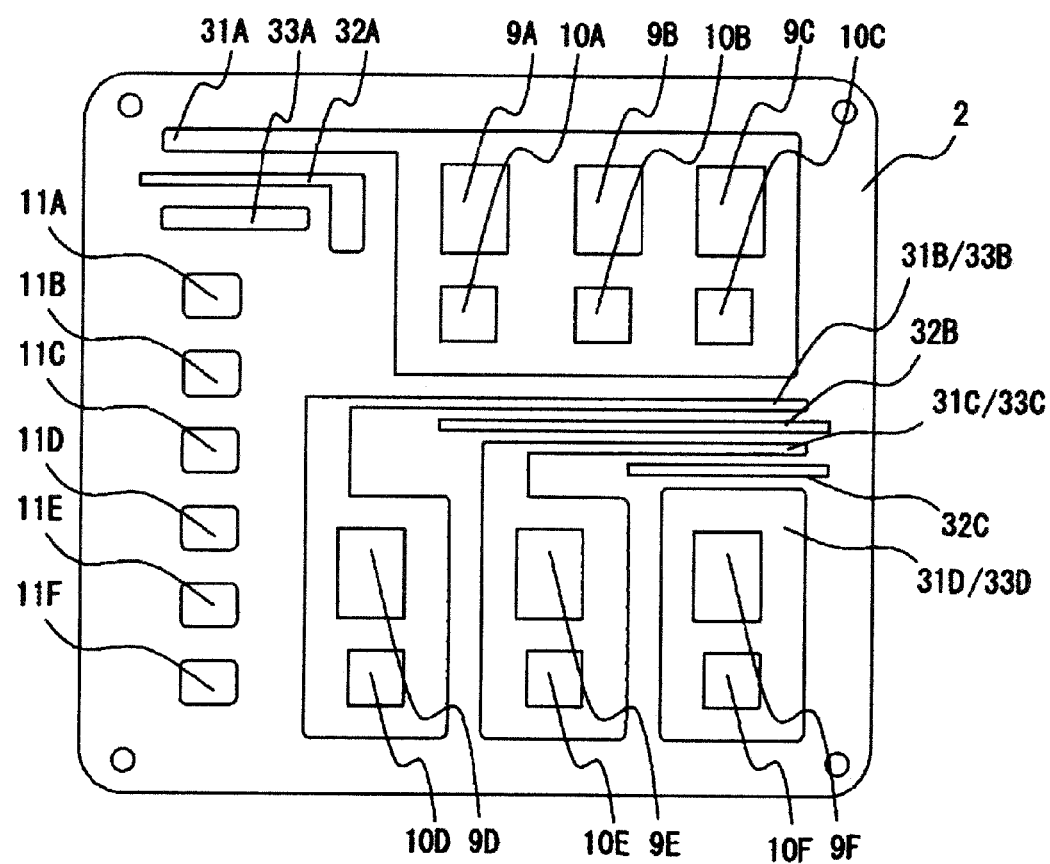
FIG. 8 Plan view of the insulation circuit board at the time when the invention is applied to an inverter circuit board for driving a motor.

FIG. 8 shows an embodiment in the case where the invention is applied to a power semiconductor device or inverter module having an inverter circuit board of a motor control system.

Figure 9:
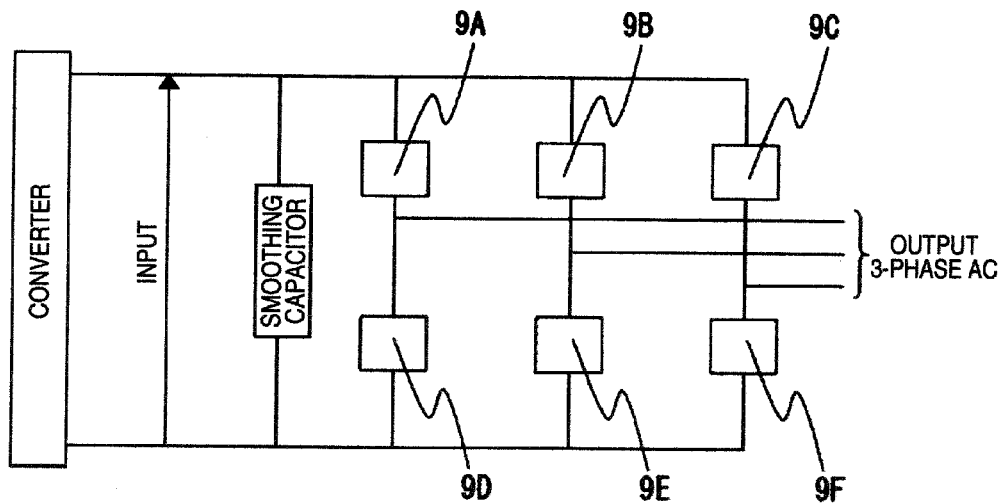
FIG. 9 Circuit diagram for explaining a circuit construction of the inverter for driving the motor.

In an outline of the inverter circuit of the motor control system, generally, as shown in a circuit diagram of FIG. 9, an inverter of three-phase outputs using six switching elements 9 is used. According to the inverter for the motor control, a DC current from a converter is input through a smoothing capacitor and is converted into a 3-phase alternating current by the switching element 9, thereby rotating the motor. A wiring construction shown in FIG. 8 here is obtained by presuming an inverter for a high output and six IGBT switching elements 9A to 9F and six free wheeling diodes 10A to 10F are mounted.

Among the wiring patterns 3 shown in FIG. 8 here, the wiring patterns which provide the highest potential difference are the wiring patterns between the input and the ground and an output portion of the three-phase AC. Therefore, wiring patterns 32A, 32B, and 32C showing the intermediate electric potential are respectively arranged into them, thereby reducing the electric field concentration at the end sections of wiring patterns 31A, 31B, 31C, and 31D on the high potential side. Although the six wiring patterns 3 on the left side in FIG. 8 are wiring patterns 11A to 11F for a gate signal for controlling the IGBT switching elements 9A to 9F, generally, since a gate signal voltage is small, the wiring pattern 32 to lighten the electric field concentration is not arranged. Wiring patterns 33A to 33D on the low potential side may be used in place of the wiring patterns 31A to 33D on the high potential side.

According to the embodiment, even in the power semiconductor device or inverter module using the high-density mounting wirings in which the distance between the wiring patterns is small, the power semiconductor device or inverter module having the high insulation reliability can be realized at low costs.

Third Embodiment

Electric Field Simulation

In order to verify an effect of the invention hereinbelow, analysis models are formed for the embodiments of the invention and comparative examples and local electric fields at the end sections of the high-potential wiring pattern 31 are derived by simulation.

Figure 10:
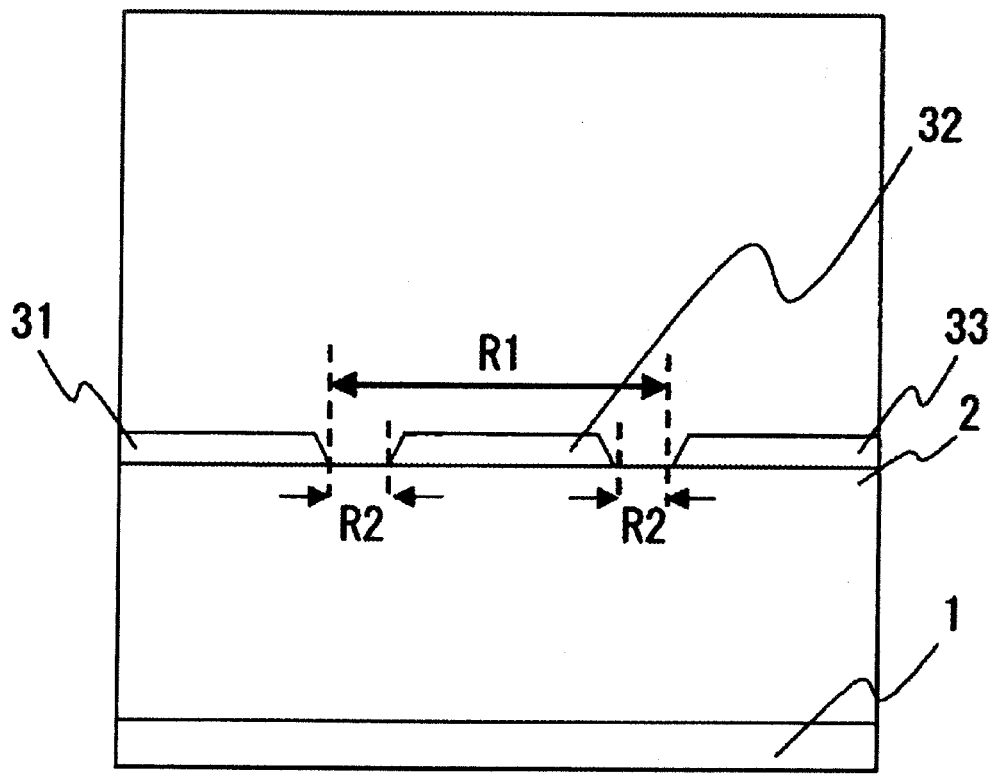
FIG. 10 Cross sectional analysis model view of the insulation circuit board and the wiring patterns using the embodiment of the invention.

FIG. 10 is a cross sectional model view for analyzing the insulation circuit board according to the embodiment of the invention.

The epoxy resin (dielectric constant: 4) insulation layer 2 having a thickness of 2.0 mmt is formed on the metal base substrate 1 having a thickness of 2.0 mmt and an electrolytic copper foil having a thickness of 0.1 mmt is further adhered onto the insulation layer 2. After that, the wiring patterns 31 and 33 formed by the chemical etching and the wiring pattern 32 according to the invention are formed onto the copper foil. An inclination angle of the side surface of each of the wiring patterns 31, 32, and 33 is equal to 60°. The wiring patterns 31 and 33 are away from each other by the distance R1 between the wiring patterns. Further, the wiring pattern 32 is arranged at the position of the distance R2 between the wiring patterns corresponding to the equal distance from each of the wiring patterns 31 and 33. Electric potentials of the wiring patterns 31, 32, and 33 are equal to 900V, 450V, and 0V, respectively.

Fourth Embodiment

Figure 11:
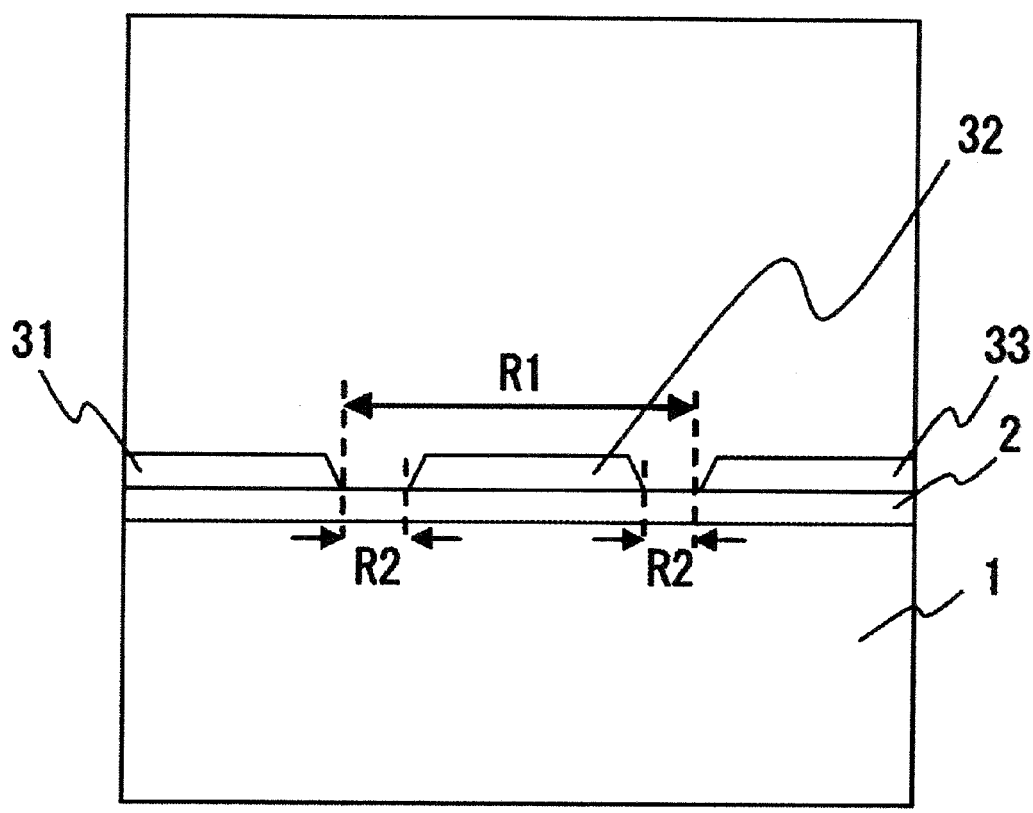
FIG. 11 Cross sectional analysis model view of an insulation circuit board and wiring patterns according to another embodiment of the invention.

FIG. 11 is a cross sectional model view for analyzing the insulation circuit board according another embodiment of the invention.

The epoxy resin (dielectric constant: 4) insulation layer 2 having a thickness of 0.2 mmt is formed on the metal base substrate 1 having a thickness of 2.0 mmt and an electrolytic copper foil having a thickness of 0.1 mmt is further adhered onto the insulation layer 2. After that, the wiring patterns 31 and 33 formed by the chemical etching and the wiring pattern 32 according to the invention are formed onto the copper foil. An inclination angle of the side surface of each of the wiring patterns 31, 32, and 33 is equal to 60°. The wiring patterns 31 and 33 are away from each other by the distance R1 between the wiring patterns. Further, the wiring pattern 32 is arranged at the position of the distance R2 between the wiring patterns corresponding to the equal distance from each of the wiring patterns 31 and 33. Electric potentials of the wiring patterns 31, 32, and 33 are equal to 900V, 450V, and 0V, respectively.

Fifth Embodiment

Figure 12:
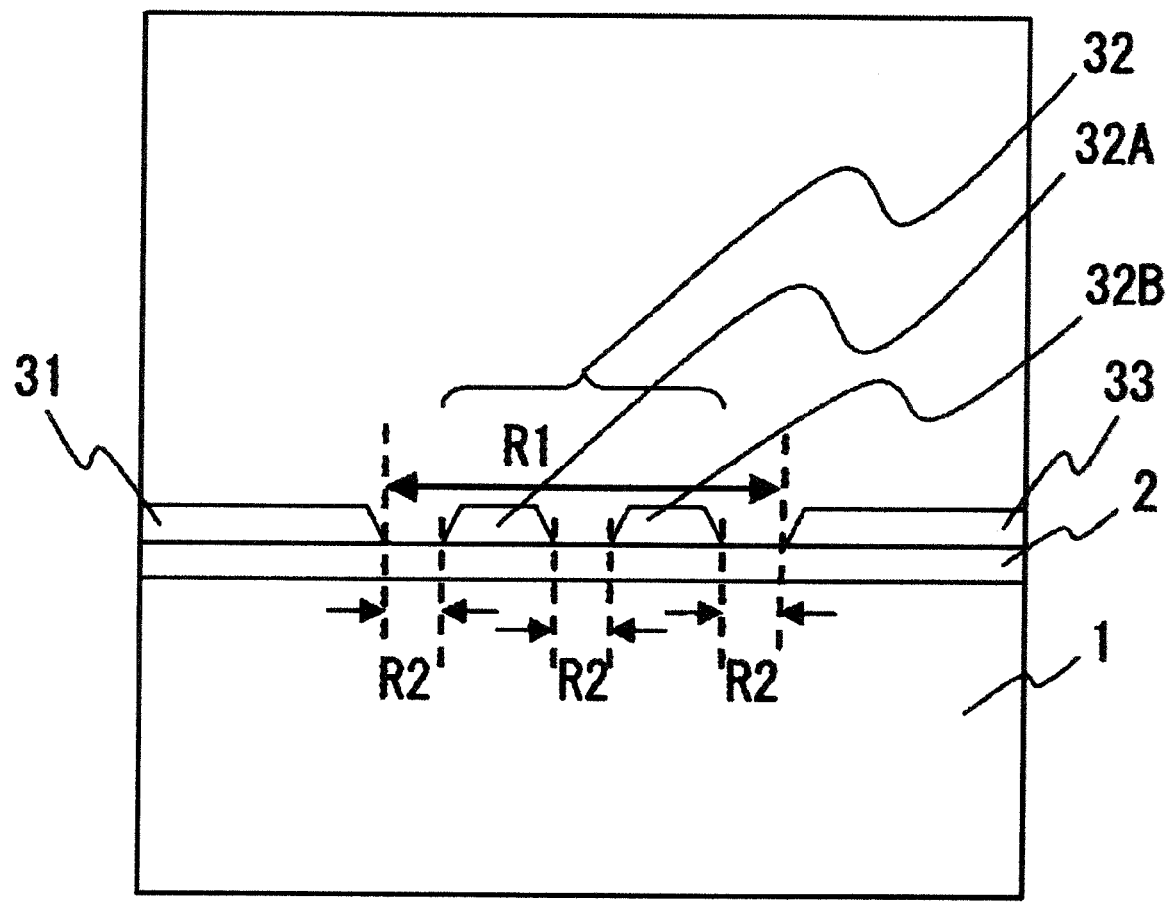
FIG. 12 Cross sectional analysis model view of an insulation circuit board and wiring patterns according to still another embodiment of the invention.

FIG. 12 is a cross sectional model view for analyzing the insulation circuit board according another embodiment of the invention.

The epoxy resin (dielectric constant: 4) insulation layer 2 having a thickness of 0.2 mmt is formed on the metal base substrate 1 having a thickness of 2.0 mmt and an electrolytic copper foil having a thickness of 0.1 mmt is further adhered onto the insulation layer 2. After that, the wiring patterns 31 and 33 formed by the chemical etching and the wiring patterns 32A and 32B according to the invention are formed onto the copper foil. An inclination angle of the side surface of each of the wiring patterns 31, 33, 32A, and 32B is equal to 60°. The wiring patterns 31 and 33 are away from each other by the distance R1 between the wiring patterns. Further, the wiring patterns 32A and 32B are arranged at the positions of the distance R2 between the wiring patterns corresponding to the equal distance from each of the wiring patterns 31 and 33. Electric potentials of the wiring patterns 31, 32A, 32B, and 33 are equal to 900V, 600V, 300V, and 0V, respectively.

Sixth Embodiment

Figure 13:
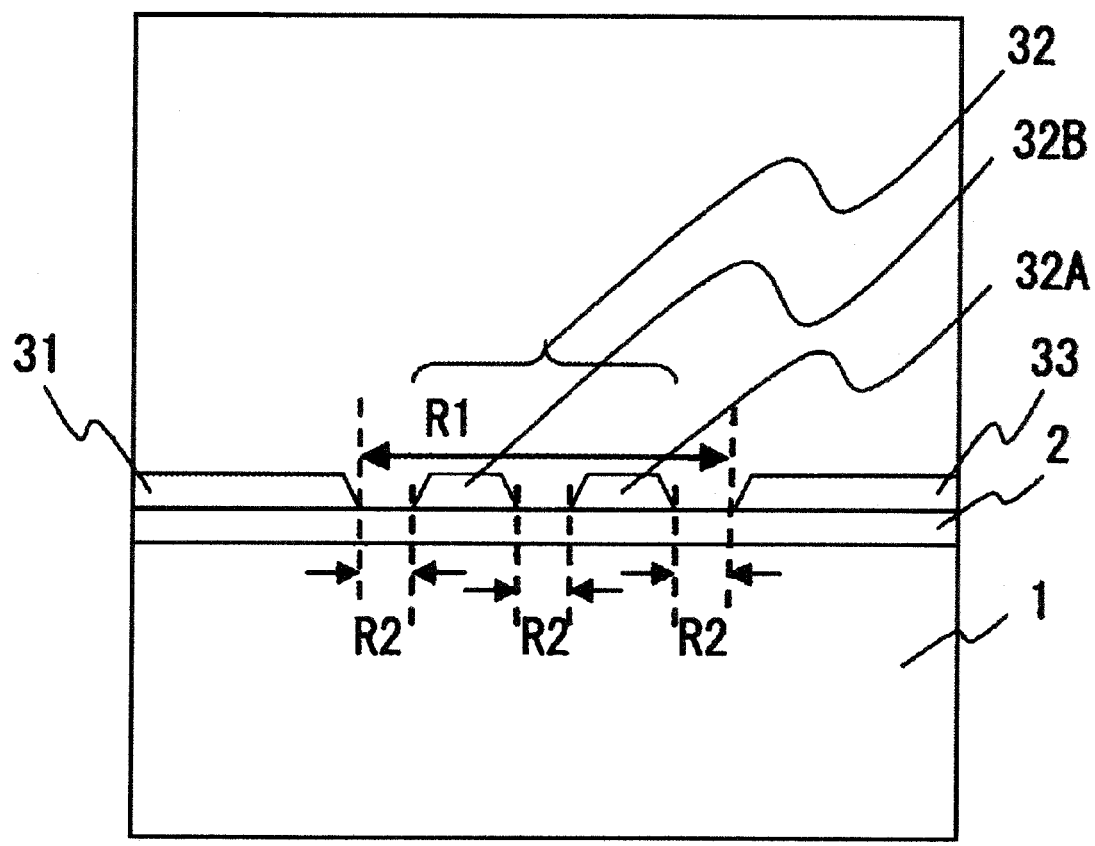
FIG. 13 Cross sectional analysis model view of an insulation circuit board and wiring patterns according to further another embodiment of the invention.

FIG. 13 is a cross sectional model view for analyzing the insulation circuit board according another embodiment of the invention.

The epoxy resin (dielectric constant: 4) insulation layer 2 having a thickness of 0.2 mmt is formed on the metal base substrate 1 having a thickness of 2.0 mmt and an electrolytic copper foil having a thickness of 0.1 mmt is further adhered onto the insulation layer 2. After that, the wiring patterns 31 and 33 formed by the chemical etching and the wiring patterns 32B and 32A according to the invention are formed onto the copper foil. An inclination angle of the side surface of each of the wiring patterns 31, 33, 32B, and 32A is equal to 60°. The wiring patterns 31 and 33 are away from each other by the distance R1 between the wiring patterns. Further, the wiring patterns 32B and 32A are arranged at the positions of the distance R2 between the wiring patterns corresponding to the equal distance from each of the wiring patterns 31 and 33. Electric potentials of the wiring patterns 31, 32A, 32B and 33 are equal to 900V, 600V, 300V, and 0V, respectively.

Comparative Example 1

Figure 14:
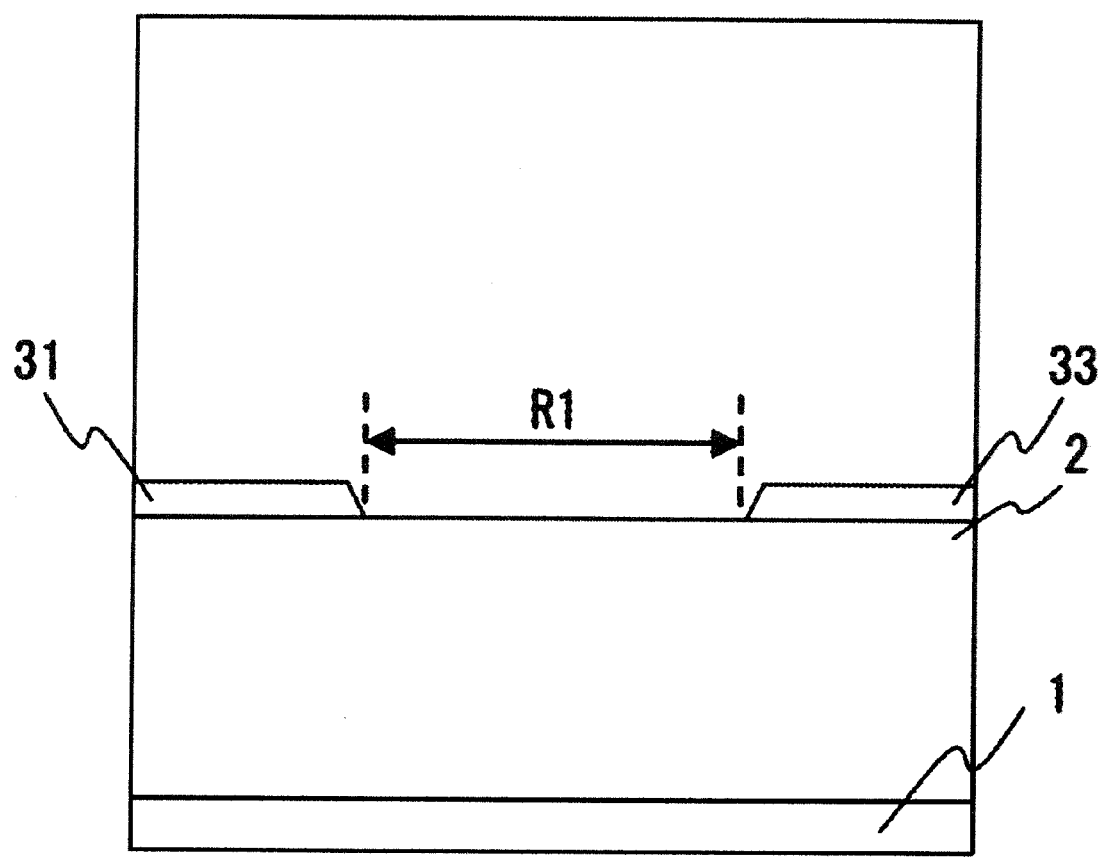
FIG. 14 Cross sectional analysis model view of conventional insulation circuit board and wiring patterns.

FIG. 14 is a cross sectional model view for analysis which simulates the insulation circuit board by the conventional wiring patterns 3.

The epoxy resin (dielectric constant: 4) insulation layer 2 having a thickness of 2.0 mmt is formed on the metal base substrate 1 having a thickness of 2.0 mmt and an electrolytic copper foil having a thickness of 0.1 mmt is further adhered onto the insulation layer 2. After that, the wiring patterns 31 and 33 formed by the chemical etching are formed onto the copper foil. An inclination angle of the side surface of each of the wiring patterns 31 and 33 is equal to 60°. The wiring patterns 31 and 33 are away from each other by the distance R1 between the wiring patterns. Further, electric potentials of the wiring patterns 31 and 33 are equal to 900V and 0V, respectively.

Comparative Example 2

Figure 15:
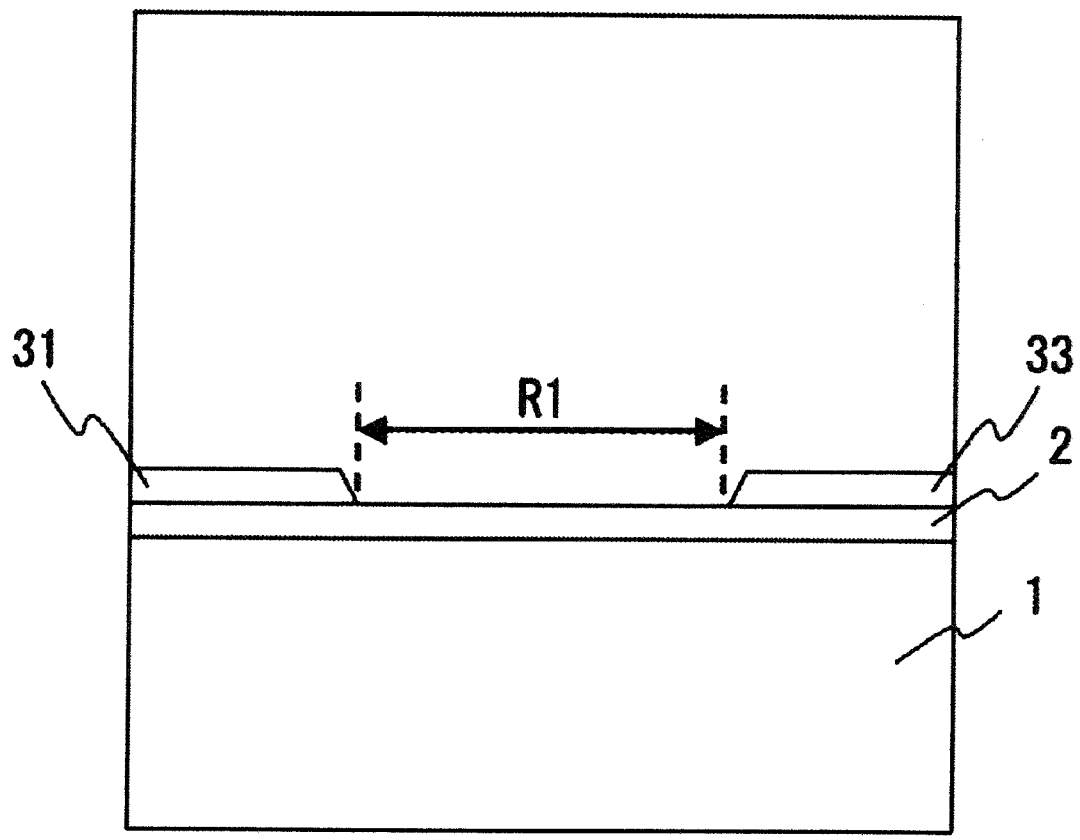
FIG. 15 Cross sectional analysis model view of other conventional insulation circuit board and wiring patterns.

FIG. 15 is a cross sectional model view for analysis which simulates another insulation circuit board by the conventional wiring patterns 3.

The epoxy resin (dielectric constant: 4) insulation layer 2 having a thickness of 0.2 mmt is formed on the metal base substrate 1 having a thickness of 2.0 mmt and an electrolytic copper foil having a thickness of 0.1 mmt is further adhered onto the insulation layer 2. After that, the wiring patterns 31 and 33 formed by the chemical etching are formed onto the copper foil. An inclination angle of the side surface of each of the wiring patterns 31 and 33 is equal to 60°. The wiring patterns 31 and 33 are away from each other by the distance R1 between the wiring patterns. Further, electric potentials of the wiring patterns 31 and 33 are equal to 900V and 0V, respectively.

(Simulation Result 1)

To the analysis model of the embodiment shown in FIG. 10 using the wiring pattern construction on the insulation circuit board according to the invention and the analysis model of Comparative Example 1 shown in FIG. 14 which simulates the wiring pattern construction on the conventional insulation circuit board, an analysis in the case where a pattern width of the wiring pattern 32 is fixed to 0.5 mm, the distance R1 between the wiring patterns is changed to 1.0 mm, 1.5 mm, and 2.0 mm is performed.

TABLE 1 shows local electric field ratios of the end sections of the wiring pattern 31 on the high potential side in the embodiment shown in FIG. 10 to the local electric fields at the end sections of the wiring pattern 31 on the high potential side which are calculated in Comparative Example 1 when the distance R1 between the wiring patterns is respectively equal to 1.0 mm, 1.5 mm, and 2.0 mm. The embodiment shown in FIG. 10 and Comparative Example 1 relate to the analysis models in which the thickness of insulation layer 2 is equal to a thick value of 2.0 mmt. This is because it is intended to eliminate an influence of the metal base substrate 1 to the local electric fields at the end sections of the wiring pattern 31 on the high potential side by sufficiently providing the distance between the wiring pattern 31 on the high potential side and the metal base substrate 1. That is, according to the embodiment shown in FIG. 10 and Comparative Example 1, a contribution of the wiring pattern 33 or the wiring patterns 32 and 33 to the local electric fields at the end sections of the wiring pattern 31 on the high potential side is large. Therefore, TABLE 1 shows results in which the effects owing to the invention were solely evaluated.

As shown in TABLE 1, the local electric fields at the end sections of the wiring pattern 31 on the high potential side in the embodiment shown in FIG. 10 is lower than the local electric fields at the end sections of the wiring pattern 31 on the high potential side in Comparative Example 1 irrespective of the distance R1 between the wiring patterns. Therefore, by arranging the wiring pattern 32 according to the invention between the wiring patterns 31 and 33 showing the high potential difference, the reducing effect of the local electric fields at the end sections of the wiring pattern 31 on the high potential side is obtained.

TABLE 1

| Distance R1 between the wiring patterns | Comparative Example 1 | FIG. 6 |
|---|---|---|
| 1.0 mm | 100.00% | 96.46% |
| 1.5 mm | 100.00% | 97.43% |
| 2.0 mm | 100.00% | 97.37% |

(Simulation Result 2)

To the analysis models of the embodiments shown in FIGS. 11, 12, and 13 using the wiring pattern construction on the insulation circuit board according to the invention and the analysis model of Comparative Example 2 shown in FIG. 15 which simulates the wiring pattern construction on the conventional insulation circuit board, an analysis in the case where pattern widths of the wiring patterns 32, 32A, and 32B are fixed to 0.5 mm, the distance R1 between the wiring patterns is changed to 1.0 mm, 1.5 mm, and 2.0 mm is performed.

TABLE 2 shows local electric field ratios of the end sections of the wiring pattern 31 on the high potential side in Comparative Example 2 and the embodiments of FIGS. 11, 12, and 13 to the local electric fields at the end sections of the wiring pattern 31 on the high potential side in Comparative Example 2 when the distance R1 between the wiring patterns is set to 1.0 mm. In Comparative Example 2 and the embodiments of FIGS. 11, 12, and 13, the thickness of insulation layer 2 is set to a thin value of 0.2 mmt and is close to the thickness of insulation layer 2 of the actual insulation circuit board. Therefore, TABLE 2 shows results in which the effects owing to the invention were evaluated to the model that is closer to the actual insulation circuit board construction. A numerical value in parentheses in the results of the embodiments of FIGS. 11, 12, and 13 indicates the distance R2 between the wiring patterns.

TABLE 2

| Distance R1 between the wiring patterns | Comparative Example 2 | FIG. 11 (distance R2 between the wiring patterns) | FIG. 12 (R2) | FIG. 13 (R2) |
| --- | --- | --- | --- | --- |
| 1.0 mm | 100.00% | 92.8% (0.25 mm) | — | — |
| 1.5 mm | 100.02% | 97.05% (0.5 mm) | 84.11% (0.17 mm) | 92.89% (0.17 mm) |
| 2.0 mm | 100.02% | 98.05% (0.75 mm) | 92.73% (0.33 mm) | 95.83% (0.33 mm) |

As shown in TABLE 2, in Comparative Example 2, the local electric fields at the end sections of the wiring pattern 31 on the high potential side is not changed even if the distance R1 between the wiring patterns differs. This means that the local electric fields at the end sections of the wiring pattern 31 on the high potential side is strongly influenced by the metal base substrate 1 which is closely arranged and an influence by the wiring pattern 33 on the low potential side is small. On the other hand, in the embodiments of FIGS. 11, 12, and 13, the local electric fields at the end sections of the wiring pattern 31 on the high potential side in Comparative Example 2 is reduced, respectively. Therefore, even in the local electric fields at the end sections of the wiring pattern 31 on the high potential side which is strongly influenced by the metal base substrate 1, the effect of the invention can be sufficiently obtained. Particularly, the smaller the distance R1 between the wiring patterns is, the larger the effect is. As shown in the results of the embodiments of FIGS. 12 and 13, by arranging a larger number of wiring patterns 32 between the wiring patterns 31 and 33 showing the high potential difference, the effect of the invention increases larger. On the other hand, according to the embodiment of FIG. 13 in which the arranging order of the wiring patterns 32A and 32B is reversed from that in the embodiment of FIG. 12, although the local electric fields at the end sections of the wiring pattern 31 on the high potential side in Comparative Example 2 is reduced, the effect of the invention is smaller than that in the embodiment of FIG. 12. Therefore, by arranging a larger number of wiring patterns 32 between the wiring patterns 31 and 33 showing the high potential difference and by sequentially decreasing the electric potentials of the wiring patterns 32 in the direction from the wiring pattern 31 on the high potential side toward the wiring pattern 33 on the low potential side, the effect of the invention can be obtained larger.

(Simulation Result 3)

To evaluate the influence which is exerted on the reducing effect of the local electric fields at the end sections of the wiring pattern 31 on the high potential side according to the invention by the distance R2 between the wiring patterns, an analysis in the case where the distance R2 between the wiring patterns in the embodiments of FIGS. 11 and 12 is fixed to 0.25 mm and 0.5 mm and the pattern widths of the wiring patterns 32, 32A, and 32B are properly changed is performed.

TABLE 3 shows local electric field ratios of the end sections of the wiring pattern 31 on the high potential side in the embodiments of FIGS. 11 and 12 to the local electric fields at the end sections of the wiring pattern 31 on the high potential side in Comparative Example 2 (the distance R1 between the wiring patterns is equal to 2.0 mm) calculated in the simulation result 2. Numerical values in parentheses in the embodiment of FIG. 12 indicate the distance R1 between the wiring patterns and the pattern widths of the wiring patterns 32A and 32B.

TABLE 3

| Distance R2 between the wiring patterns | FIG. 11 | FIG. 12 (distance R1 between the wiring patterns/pattern widths of the wiring patterns 32A and 32B) |
| --- | --- | --- |
| 0.25 mm | 92.78% | 89.34% (1.5 mm/0.375 mm) |
| | | 89.25% (2.0 mm/0.625 mm) |
| 0.5 mm | 97.02% | 95.83% (2.0 mm/0.25 mm) |

As shown in TABLE 3, in the embodiments of FIGS. 11 and 12, the smaller the distance R2 between the wiring patterns is, the more the local electric fields at the end sections of the wiring pattern 31 on the high potential side is reduced. Therefore, by arranging the wiring pattern 32 according to the invention between the wiring patterns 31 and 33 showing the high potential difference at a distance position where it is closer to the wiring patterns 31 and 33, the effect of the invention is largely obtained. In the embodiment of FIG. 12 when the distance R2 between the wiring patterns is equal to 0.25 mm, even if the distance R1 between the wiring patterns differs, an almost equal reducing effect is obtained. Therefore, when the distance R2 between the wiring patterns is constant, the effect of the invention does not depend on the pattern widths of the wiring patterns 32A and 32B. Therefore, the width of the wiring pattern 32 is further decreased and a larger number of wiring patterns 32 in which the electric potentials decrease sequentially in the direction from the high-potential wiring pattern 31 toward the low-potential wiring pattern 33 are arranged between the wiring patterns 31 and 33 showing the high potential difference, so that the effect of the invention can be obtained larger.

Although the embodiments have been mentioned above, the invention is not limited to them but it will be obvious to a person with ordinary skill in the art that various changes and modifications are possible within the spirit of the invention and the scope of annexed claims.

| REFERENCE SIGNS LIST | |
| --- | --- |
| 1. | Metal base substrate |
| 2. | Insulation layer |
| 3. | Wiring pattern |
| 4. | Partial discharging |
| 5. | Tree deterioration |
| 6. | Creeping discharge |
| 7. | Concave portion of insulation layer |
| 8. | Resistor |
| 81. | Chip resistor |
| 9. | Switching element/IGBT switching element |
| 10. | Free wheeling diode |
| 11. | Wiring pattern for gate signal |
| R1. | Distance between the wiring patterns 31-33 |
| R2. | Distance between the wiring patterns 31-32, 31-32A, 31A-32B, 32B-33, and 32-33 |
| R3. | Orientation length of the wiring patterns 31 and 33 |
| R4. | Length of the wiring pattern 32 |

The invention claimed is:
1. An insulation circuit board comprising:
a metal base substrate;
an insulation layer;
a first wiring pattern which is formed onto at least one surface of the metal base substrate through the insulation layer;
a second wiring pattern which is formed onto at least one surface of the metal base substrate through the insulation layer, and
a third wiring pattern which is in contact with the insulation layer, at least a portion of the third wiring pattern located between the first wiring pattern and the second wiring pattern where the distance between the first wiring pattern and second wiring pattern is closest, and the third wiring pattern configured not to be coupled to an electric ground potential and configured to divide a voltage between the first wiring pattern and the second wiring pattern, wherein an electric potential difference exists between the first wiring pattern and the second wiring pattern, and wherein the third wiring pattern has an electric potential in a range of the electric potential difference between the first wiring pattern and the second wiring pattern.

2. The insulation circuit board according to claim 1, characterized in that the insulation layer which is in contact with the metal base substrate and the first wiring pattern, second wiring pattern and third wiring pattern comprises at least one selected from the group consisting of a resin mainly consisting of an epoxy resin, a resin mainly consisting of a polyimide resin, a resin mainly consisting of a silicone resin, a resin mainly consisting of an acrylic resin, a resin mainly consisting of an urethane resin and a resin consisting of a denatured material or mixture of those resins.

3. The insulation circuit board according to claim 2, characterized in that the insulation layer comprises at least one selected from the group consisting of $Al_2O_3$ (alumina), $SiO_2$ (silica), AlN (aluminum nitride), BN (boron nitride), ZnO (zinc oxide), SiC (silicon carbide), $Si_3N_4$ (silicon nitride), MgO (magnesium oxide), and a filler adapted to improve heat radiation performance and insulation performance in a manner similar to those compounds.

4. The insulation circuit board according to claim 1, characterized in that the insulation layer which is in contact with the metal base substrate and the first wiring pattern, second wiring pattern and third wiring pattern comprises at least one selected from the group consisting of a ceramic material mainly consisting of $Al_2O_3$ (alumina), $ZrO_2$ (zirconia), AlN (aluminum nitride), or BN (boron nitride), a ceramic material which has characteristics similar to those of the ceramic materials, whose fundamental component consists of a metal oxide, and which is burned and solidified by a heat treatment of a high temperature, and an inorganic material consisting of a denatured material or mixture obtained by mixing a glass component into a ceramic material.

5. The insulation circuit board according to claim 1, characterized in that in order to provide the electric potential in the range of the potential difference between the first wiring pattern and the second wiring pattern, a resistor is arranged between the first wiring pattern and the second wiring pattern where the electric potential difference exists.

6. A power semiconductor device or inverter module characterized in that one of the insulation circuit boards according to claim 1 is used, circuit parts including semiconductor elements connected to the first wiring pattern and second wiring pattern are mounted, and the first wiring pattern, second wiring pattern and third wiring pattern are arranged.

7. The insulation circuit board according to claim 1, wherein the electric potential difference between the first wiring pattern and the second wiring pattern is less than or equal to 350V.

8. A power semiconductor device comprising:
a metal base substrate;
an insulation layer;
a first wiring pattern which is formed onto at least one surface of the metal base substrate through the insulation layer;
a second wiring pattern which is formed onto at least one surface of the metal base substrate through the insulation layer; and
a plurality of semiconductor elements connected to the first wiring pattern and second wiring pattern; and
a third wiring pattern which is in contact with the insulation layer, at least a portion of the third wiring pattern located between the first wiring pattern and the second wiring pattern, and the third wiring pattern not connected to a semiconductor device of the plurality of semiconductor devices, wherein an electric potential difference exists between the first wiring pattern and the second wiring pattern and the third wiring pattern has an electric potential in a range of the electric potential difference between the first wiring pattern and the second wiring pattern.

9. The power semiconductor device according to claim 8, characterized in that the first wiring pattern and the second wiring pattern are an input potential wiring pattern and a ground potential wiring pattern.

10. The power semiconductor device according to claim 8, characterized in that the first wiring pattern and the second wiring pattern are output wiring patterns of a three-phase alternating current connected to the semiconductor elements.

11. An inverter module characterized by having one power semiconductor device according to claim 8.

12. The power semiconductor device according to claim 8, wherein the electric potential difference between the first wiring pattern and the second wiring pattern is less than or equal to 350V.

* * * * *